(12) United States Patent
Trivedi et al.

(10) Patent No.: US 9,438,212 B2
(45) Date of Patent: Sep. 6, 2016

(54) CONCURRENT TRUE AND COMPLEMENT SIGNAL GENERATION

(71) Applicant: LSI Corporation, Milpitas, CA (US)

(72) Inventors: Manish Trivedi, Uttar Pradesh (IN); Manish Umedlal Patel, Karnataka (IN)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/690,130

(22) Filed: Nov. 30, 2012

(65) Prior Publication Data

US 2014/0152366 A1 Jun. 5, 2014

(51) Int. Cl.
*H03K 3/356* (2006.01)

(52) U.S. Cl.
CPC ............................. *H03K 3/356156* (2013.01)

(58) Field of Classification Search
CPC .. G06F 1/10; H01L 2924/0002; H03K 5/133
See application file for complete search history.

(56) References Cited

U.S. PATENT DOCUMENTS

| | | | |
|---|---|---|---|
| 4,169,233 A | 9/1979 | Haraszti | |
| 4,645,947 A | 2/1987 | Prak | |
| 4,910,713 A | 3/1990 | Madden et al. | |
| 4,950,920 A | 8/1990 | Hara et al. | |
| 5,130,566 A | 7/1992 | Nguyen | |
| 5,140,174 A | 8/1992 | Meier et al. | |
| 5,270,580 A | 12/1993 | Nguyen | |
| 5,491,432 A | 2/1996 | Wong et al. | |
| 5,495,189 A * | 2/1996 | Choi | 326/97 |
| 5,801,564 A * | 9/1998 | Gasparik | 327/170 |
| 5,867,043 A | 2/1999 | Kim | |
| 5,949,256 A | 9/1999 | Zhang et al. | |
| 6,181,182 B1 | 1/2001 | Stotz et al. | |
| 6,198,324 B1 | 3/2001 | Schober | |
| 6,239,620 B1 | 5/2001 | Aoki et al. | |
| 6,246,278 B1 | 6/2001 | Anderson et al. | |
| 6,252,448 B1 | 6/2001 | Schober | |
| 6,333,656 B1 | 12/2001 | Schober | |
| 6,501,302 B1 | 12/2002 | Lee et al. | |
| 6,664,836 B1 | 12/2003 | Wen | |
| 6,741,104 B2 | 5/2004 | Forbes et al. | |
| 6,753,701 B2 * | 6/2004 | Chang | 326/93 |

(Continued)

OTHER PUBLICATIONS

Borivoje Nikolic, et al., "Improved Sense-Amplifier Based Flip-Flop: Design and Measurement", IEEE journal of solid-state circuits, vol. 35, No. 6, Jun. 2000, pp. 876-884.

(Continued)

*Primary Examiner* — Sibin Chen (57) ABSTRACT

A circuit generates low-skew true and complement output signals from an input signal using an inverter, true signal generation circuitry, and complement signal generation circuitry. The inverter operates between a high-voltage reference source (VDD) and a low-voltage reference source (VSS) and inverts the input signal to generate a delayed complement input signal. The true signal generation circuitry, which comprises a p-type transistor in series with an n-type transistor, (i) operates between (a) one of VDD and VSS and (b) one of the true input signal and the complement input signal and (ii) generates a true output signal. The complement signal generation circuitry, which also comprises p-type transistor in series with an n-type transistor, (i) operates between (a) one of VDD and VSS and (b) one of the true input signal and the complement input signal and (ii) generates a complement output signal.

20 Claims, 9 Drawing Sheets

(56) References Cited

U.S. PATENT DOCUMENTS

| | | |
|---|---|---|
| 6,798,265 B2 * | 9/2004 | Nair et al. .................... 327/291 |
| 7,378,876 B2 | 5/2008 | Vu |
| 7,724,036 B2 * | 5/2010 | Das ...................... H03K 19/096 326/93 |
| 8,027,214 B2 | 9/2011 | Lin et al. |
| 2005/0134347 A1 | 6/2005 | Rusu et al. |
| 2006/0168487 A1 | 7/2006 | Mak et al. |
| 2007/0241794 A1 | 10/2007 | Wang et al. |
| 2008/0048731 A1 | 2/2008 | Huang |
| 2010/0172199 A1 | 7/2010 | Mishra et al. |
| 2010/0237908 A1 | 9/2010 | Chatal |

OTHER PUBLICATIONS

Antonio G.M, et al., "A Novel High-Speed Sense-Amplifier Based Flip-Flop", IEEE transactions on VLSI systems, vol. 13, No. 11, Nov. 2005, pp. 1266-1274.

* cited by examiner

CONCURRENT TRUE AND COMPLEMENT SIGNAL GENERATION

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

SUMMARY

In one embodiment, a true and complement signal generation circuit comprises an inverter, true signal generation circuitry and complement signal generation circuitry. The inverter (i) operates between a high-voltage reference source, and a low-voltage reference source, (ii) receives a true input signal, and (iii) generates a complement input signal being the complement of the true input signal. The true signal generation circuitry (i) operates between (a) one of the high-voltage reference source and the low-voltage reference source and (b) one of the true input signal and the complement input signal and (ii) generates a true output signal. The complement signal generation circuitry (i) operates between (a) one of the high-voltage reference source and the low-voltage reference source and (b) one of the true input signal and the complement input signal and (ii) generates a complement output signal.

BRIEF DESCRIPTION OF THE DRAWINGS

Embodiments of the disclosure will become more fully apparent from the following detailed description, the appended claims, and the accompanying drawings in which like reference numerals identify similar or identical elements.

DETAILED DESCRIPTION

Figure 1:
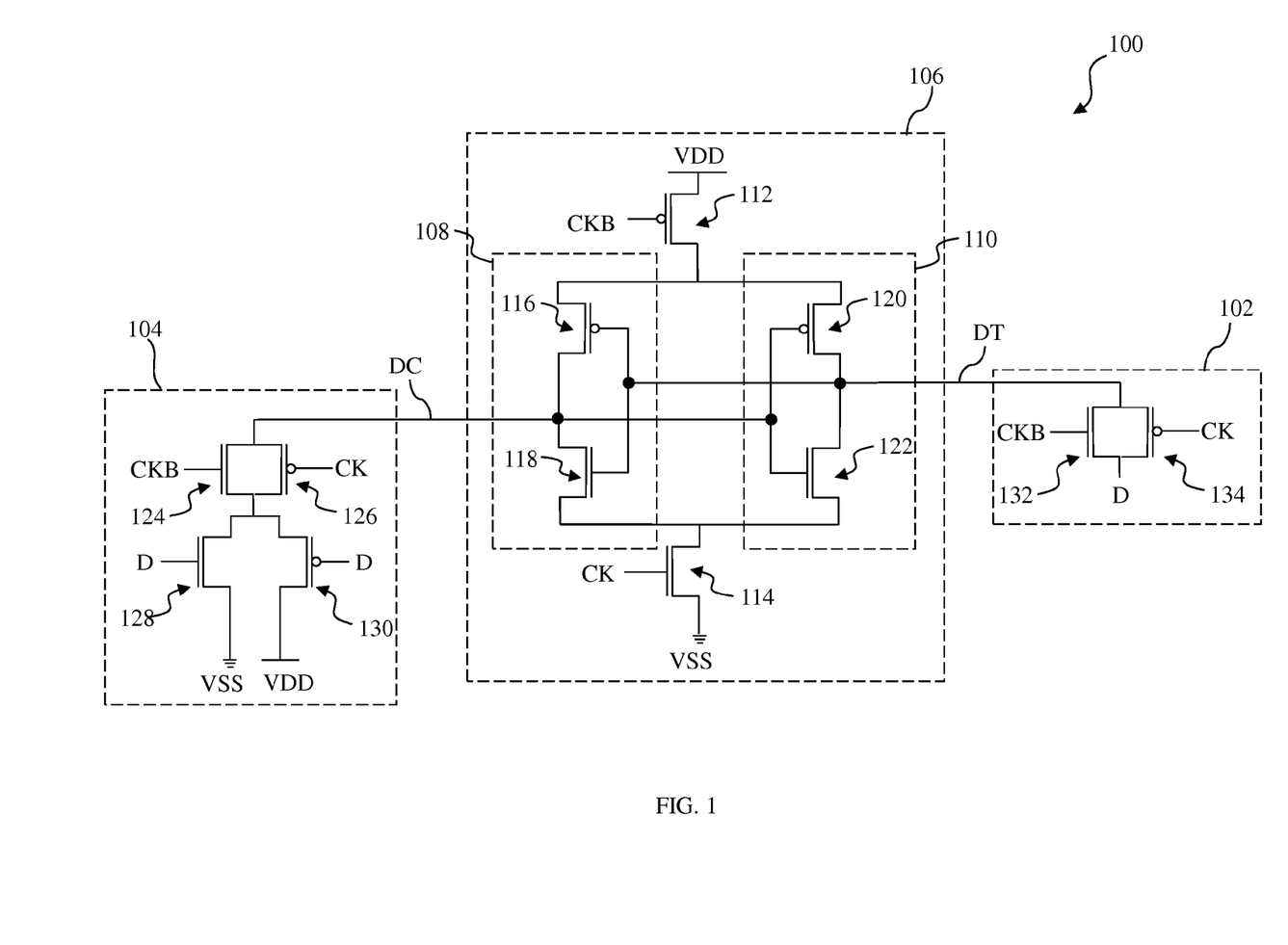
FIG. 1 shows a simplified schematic diagram of a sense-amplifier-based latch circuit according to one embodiment of the disclosure.

Referring now to FIG. 1, sense-amplifier-based latch circuit 100 comprises a true data node DT, a complement data node DC, true node setup circuitry 102, complement node setup circuitry 104, and amplification circuitry 106 comprising a pair of cross-coupled inverters 108 and 110, a p-type transistor 112, and an n-type transistor 114.

True node setup circuitry 102 selectively connects true data node DT to an input data signal D using a pair of parallel transistors, whose channels are coupled between the true data node DT and the input data signal D. The first transistor 134 in the pair is a p-type transistor, whose gate is controlled by a clock signal CK, and the second transistor 132 in the pair is an n-type transistor whose gate is controlled by a complement CKB of the clock signal CK. Transistors 134 and 132 form a transmission gate.

Complement node setup circuitry 104 selectively connects complement data node DC to either a high-voltage reference source VDD or a low-voltage reference source VSS (e.g., ground) using two pairs of transistors. The first pair of transistors is a transmission gate comprising (i) an n-type transistor 124, whose gate is controlled by the complement clock signal CKB, connected in parallel with (ii) a p-type transistor 126, whose gate is controlled by the true clock signal CK. The second pair of transistors comprises (i) an n-type transistor 128, whose gate is controlled by the input data signal D and whose channel is connected between the channels of the first pair of transistors and the low-voltage reference source VSS and (ii) a p-type transistor 130, whose gate is controlled by the input data signal D and whose channel is connected between the channels of the first pair of transistors and the high-voltage reference source VDD.

The pair of cross-coupled inverters 108 and 110, p-type transistor 112, and n-type transistor 114 of amplification circuitry 106 together selectively connect (i) one of true data node DT and complement data node DC to the high-voltage reference source VDD and (ii) the other to the low-voltage reference source VSS. Inverter 108 comprises p-type transistor 116 and n-type transistor 118, whose gates are coupled to true data node DT and channels are coupled to complement data node DC. Inverter 110 comprises p-type transistor 120 and n-type transistor 122, whose gates are coupled to complement data node DC and channels are coupled to true data node DT. In this embodiment, the cross-coupled inverters are in a balanced configuration, meaning that (i) p-type transistors 116 and 120 are the same size and (ii) n-type transistors 118 and 122 are the same size.

P-type transistor 112, the gate of which is controlled by the complement clock signal CKB, couples the channels of transistors 116 and 120 to the high-voltage source VDD. N-type transistor 114, the gate of which is controlled by the true clock signal CK, couples the channels of transistors 118 and 122 to the low-voltage reference source VSS.

In general, at the beginning of a latching operation, a setup settling operation is performed, wherein true data node DT and complement data node DC are charged to setup voltages. True node setup circuitry 102 connects true data node DT to the input data signal D, such that the true data node may be drawn upward if the input data signal D is high or downward if the input data signal D is low. Complement node setup circuitry 104 connects complement data node DC to (i) the low-voltage reference source VSS if input data signal D is high and (ii) the high-voltage reference source VDD if input data signal D is low. Thus, during this setup period, true data node DT and complement data node DC are charged or discharged to their respective setup voltages so that enough differential is developed across DT and DC nodes to be sensed by amplification circuitry 106.

After the arrival of the active edge of clock signal CK (i.e., CK is high), true node setup circuitry 102 and complement node setup circuitry 104 are turned off, and the developed differential voltage between true data node DT and complement data node DC is amplified and latched using cross-coupled inverters 108 and 110, p-type transistor 112, and n-type transistor 114. Amplification is performed by drawing (i) the node (i.e., DT or DC) having the high-voltage level upward toward VDD via p-type transistor 112 and (ii) the other node (i.e., DC or DT) having the low-voltage level downward toward VSS via n-type transistor 114. Since the transistors of cross-coupled inverters 108 and 110 are in a balanced configuration, a relatively small voltage differential is typically needed to be setup between true data node DT and complement data node DC for the latch operation to be successful.

The resulting voltages latched at true data node DT and complement data node DC represent data values. Typically, a high-voltage level corresponds to a bit value of one and a low-voltage level corresponds to a bit value of zero. The data value latched at true data node DT may be output from true data node DT to downstream processing (not shown), and, if the downstream processing also processes complement data values, then the complement data value latched at complement data node DC may be output from complement data node DC to the downstream processing. To further understand the operation of latch circuit 100, consider FIG. 2.

Figure 2:
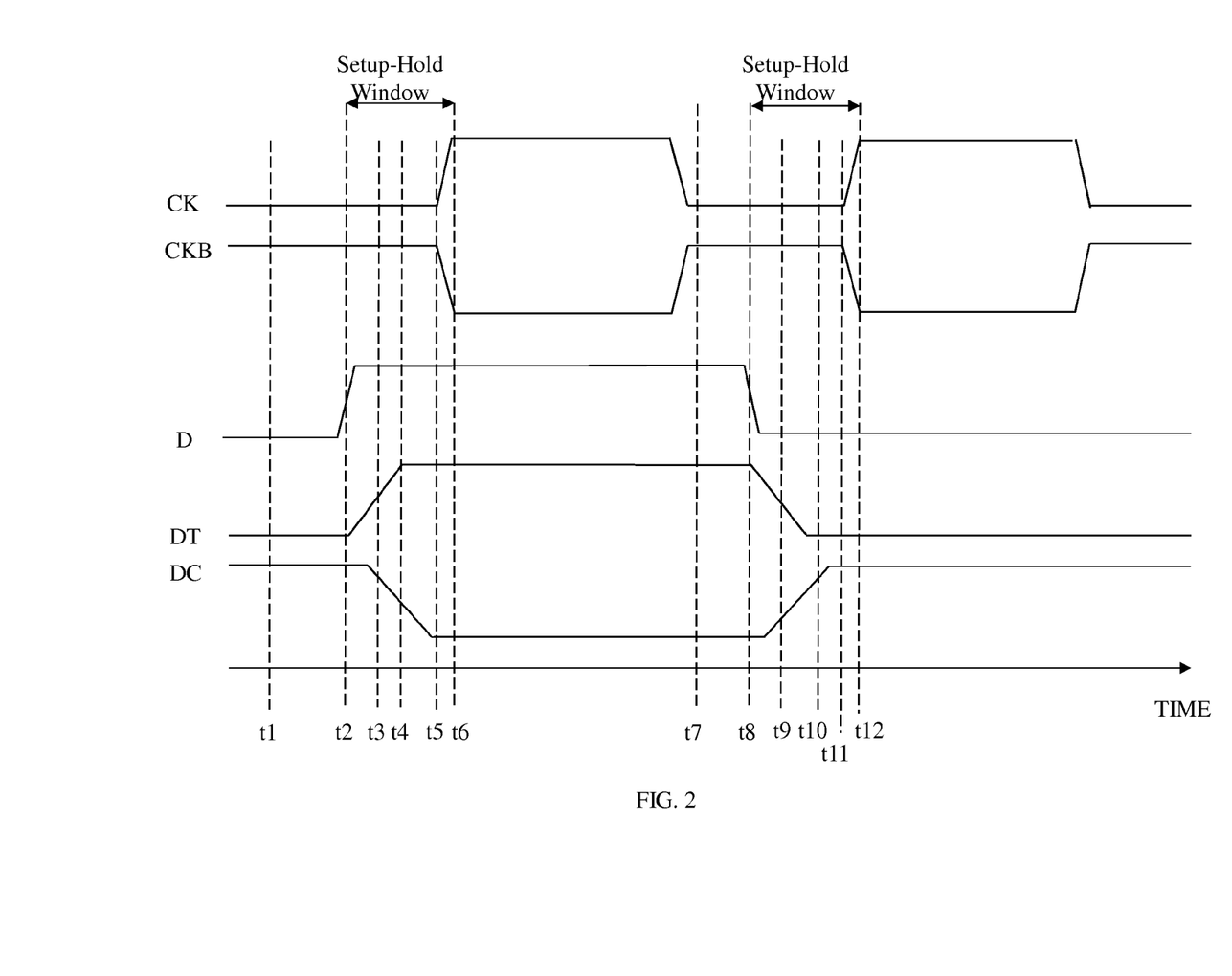
FIG. 2 shows a timing diagram of exemplary latching operations that may be performed by the latch circuit in FIG. 1.

FIG. 2 shows a timing diagram of exemplary latching operations that may be performed by latch circuit 100. Times t1 to t6 show an exemplary latching operation that latches a high data value (e.g., 1), and times t7 to t12 show an exemplary latching operation that latches a low data value (e.g., 0). At time t1, true clock signal CK is low, complement clock signal CKB is high, and input data signal D is low. As a result, p-type transistor 112 and n-type transistor 114 are off. On the right side of latch circuit 100, transistors 132 and 134 of true node setup circuitry 102 are turned on such that true data node DT is drawn downward toward the voltage level of input data signal D. On the left side of latch circuit 100, transistors 124 and 126 of true node setup circuitry 102 are turned on, n-type transistor 128 is turned off, and p-type transistor 130 is turned on such that complement data node DC is drawn upward toward the voltage level of the high voltage reference source VDD.

Just prior to time t2, the input data signal D begins to rise, and, at time t2, the setup and hold period begins. The setup period is the minimum duration of time that the input data signal D should be in an asserted state before a clock event so that the input data signal D can be reliably latched. The hold time is the minimum amount of time that the input data signal D should be held steady after the clock event so that the input data signal D can be reliably latched. For purposes of this specification, the asserted state is described as beginning when the input data signal rises or falls to 50% of the voltage level of the voltage supply source VDD. However, other conventions for measuring when the asserted state begins may be used.

As a result of input data signal D rising, true data node DT is drawn upward toward the voltage level of input data signal D beginning at time t2. Note that input data signal D rises quicker than true data node DT since node DT is driven from a transmission gate. As a result, input data signal D stops rising before time t3, whereas true data node continues to rise after time t3. Further, as a result of input data signal D rising beyond a transistor threshold level, p-type transistor 130 of complement node setup circuitry 104 is turned off and n-type transistor 128 of complement node setup circuitry 104 is turned on. This causes complement data node DC to be drawn downward toward the low-voltage reference VSS beginning somewhere between times t2 and t3.

At time t5, a clock event begins, wherein the true clock signal CK begins to rise and the complement clock signal CKB begins to fall. As a result, transistors 132 and 134 of true node setup circuitry 102 turn off such that true data node DT is isolated from input data signal D, and p-type transistor 112 is turned on such that true data node DT is drawn upward toward the high-voltage reference source VDD via p-type transistors 112 and 120 (assuming that sufficient differential between DT and DC node is developed and true data node DT was not already drawn completely up to the voltage level of the high-voltage reference source VDD by true node setup circuitry 102). Further, transistors 124 and 126 of complement node setup circuitry 104 turn off such that complement data node DC is isolated from both the high-voltage reference source VDD and the low-voltage reference source VSS paths of complement node setup circuitry 104, and n-type transistor 114 is turned on such that complement data node DC is drawn downward toward the low-voltage reference source VSS via n-type transistors 114 and 118 (assuming complement node DC was not drawn all the way down to the voltage level of the low-voltage reference source VSS by complement node setup circuitry 104).

This drawing up of true data node DT and drawing down of complement data node DC amplifies the voltage differential between nodes DT and DC. At time t6, the data has been properly latched by amplification circuitry 106, true node setup circuitry 102 and complement node setup circuitry 104 are completely isolated from DT and DC nodes, and the setup and hold period terminates, meaning that the input data signal D does not need to be held steady any longer. If it is assumed that a signal transitions at 50% of VDD, then (i) the minimum setup duration is the difference between time t2 (i.e., input data signal D reaches 50% VDD) and approximately time t4.5 (i.e., sufficient differential is developed across DT and DC nodes) and (ii) the minimum hold duration is the difference between approximately time t5.5 (i.e., true clock signal CK reaches 50%) and approximately time t5.75 (i.e., complement clock signal CKB reaches 75%).

Just prior to time t7, true clock signal CK returns to a low state and complement clock signal CKB returns to a high state prior to the next latching operation. This turns off transistors 112 and 114, turns on transistors 132 and 134 of true node setup circuitry 102, and turns on transistors 124 and 126 of complement node setup circuitry 104. Further, input data signal D is in a high state. As a result, true data node DT is drawn toward the voltage level of input signal D by true node setup circuitry 102, and n-type transistor 128 of complement node setup circuitry 104 is turned on such that complement node DC is drawn toward the voltage level of the low-voltage reference source VSS by complement node setup circuitry 104.

Just prior to time t8, the input data signal D begins to fall. As a result of input data signal D falling, true data node DT is drawn downward toward the voltage level of input data signal D beginning at time t8. Further, as a result of input data signal D falling, p-type transistor 130 of complement node setup circuitry 104 is turned on and n-type transistor 128 of complement node setup circuitry 104 is turned off.

This enables complement data node DC to be drawn upward toward the voltage level of the high-voltage reference source VDD beginning somewhere between times t8 and t9.

At time t11, a clock event begins, wherein the true clock signal CK begins to rise and the complement clock signal CKB begins to fall. As a result, transistors 132 and 134 of true node setup circuitry 102 turn off such that true data node DT is isolated from input data signal D, and n-type transistor 114 is turned on such that true data node DT is drawn downward toward the low-voltage reference source VSS via n-type transistors 114 and 122 (assuming that true data node DT was not already drawn down all the way to the voltage level of the low-voltage reference source VSS by true node setup circuitry 102). Further, transistors 124 and 126 of complement node setup circuitry 104 turn off such that node DC is isolated from the high-voltage reference source VDD and the low-voltage reference source VSS paths of complement node setup circuitry 104, and p-type transistor 112 is turned on such that complement node DC is drawn upward toward the high-voltage reference source VDD via p-type transistors 112 and 116 (assuming that complement data node DC was not already drawn up to the voltage level of the high-voltage reference source VDD by complement node setup circuitry 104).

This drawing down of true data node DT and drawing up of complement data node DC amplifies the voltage differential between nodes DT and DC. At time t12, the clock event ends and the data is properly latched, meaning that the input data signal D does not need to be held steady any longer. Thus, the minimum setup duration is the difference between time t8 (i.e., input data signal D reaches 50% of VDD) and approximately time t9.5 (i.e., sufficient differential is developed across DC and DT nodes) and the minimum hold duration is the difference between approximately time t11.5 (i.e., true clock signal CK reaches 50%) and approximately time t11.75 (i.e., complement clock signal CKB reaches 75%).

Figure 3:
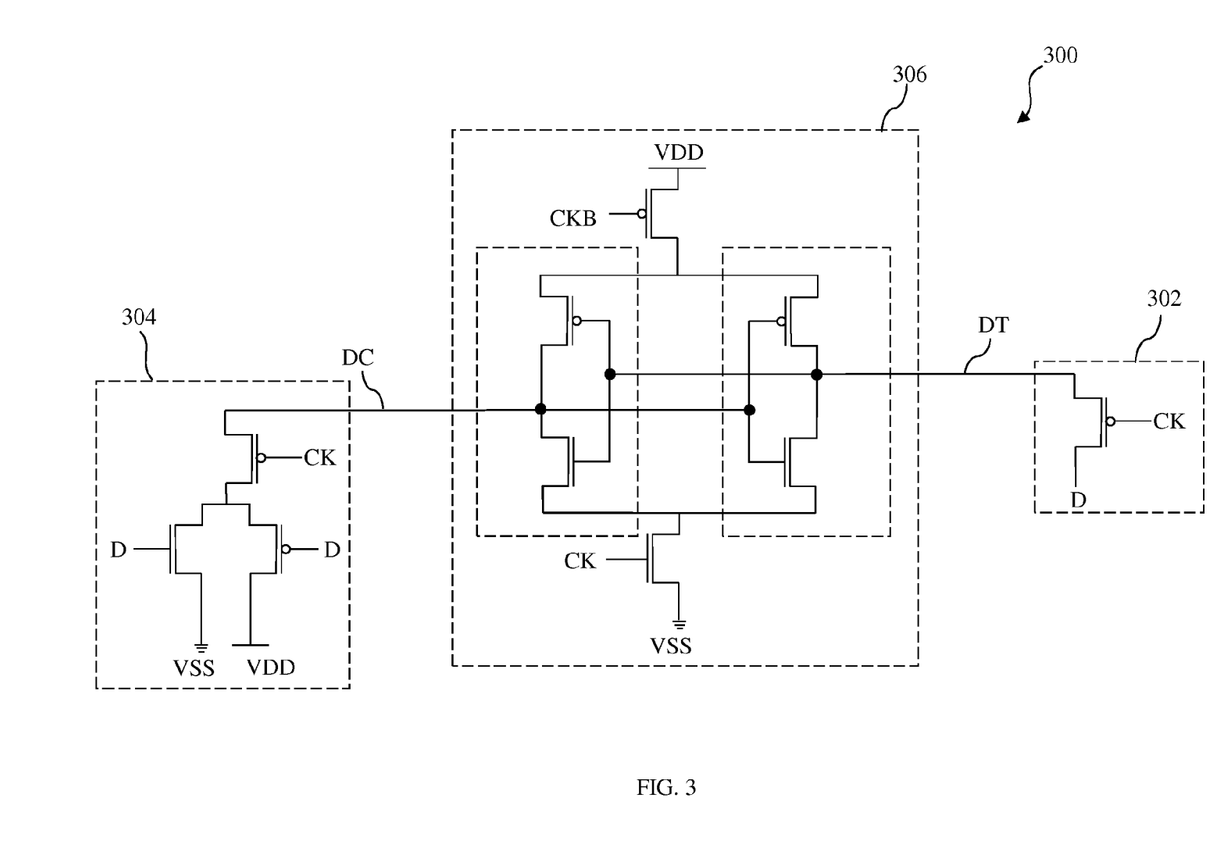
FIG. 3 shows a simplified schematic diagram of a sense-amplifier-based latch circuit according to another embodiment of the disclosure.

FIG. 3 shows a simplified schematic diagram of a sense-amplifier-based latch circuit 300 according to another embodiment of the disclosure. Latch circuit 300 has amplification circuitry 306, which is analogous to amplification circuitry 106 of FIG. 1. Latch circuit 300 also has true node setup circuitry 302 and complement nod setup circuitry 304, which perform operations similar to those of true node setup circuitry 102 and complement node setup circuitry 104 of FIG. 1, respectively.

However, true node setup circuitry 302 and complement node setup circuitry 304 are configured in slightly different manners than true node setup circuitry 102 and complement node setup circuitry 104, respectively. In particular, true node setup circuitry 302 and complement node setup circuitry 304 replace the transmission gates of true node setup circuitry 102 and complement node setup circuitry 104, respectively, with single-transistor switches. Note that each single-transistor switch comprises a p-type transistor; however, according to alternative embodiments, one or both of the single-transistor switches may comprise an n-type transistor whose gate is controlled by complement clock signal CKB.

By reducing the number of transistors, latch circuit 300 may occupy less chip area than latch circuit 100. However, true node setup circuitry 302 uses only a p-type transistor to pass the input data signal D to true data node DT, and complement node setup circuitry 304 uses only a p-type transistor to pass the high voltage reference source VDD and the low voltage reference source VSS to complement data node DC. It is generally known that a p-type transistor can conduct a strong one but weak zero and an n-type transistor can conduct strong zero but weak one. Therefore, true node setup circuitry 302 and complement node setup circuitry 304 are capable of passing strong ones to nodes DT and DC, respectively, but are not capable of passing strong zeros. Despite this inability to pass strong zeros, latch circuit 300 still operates properly if the voltage differential that is setup between the true data node DT and the complement data node DC is sufficient to be resolved by amplification circuitry 306 (e.g., ≤200 mv, even in presence of high capacitive and device mismatches).

Figure 4:
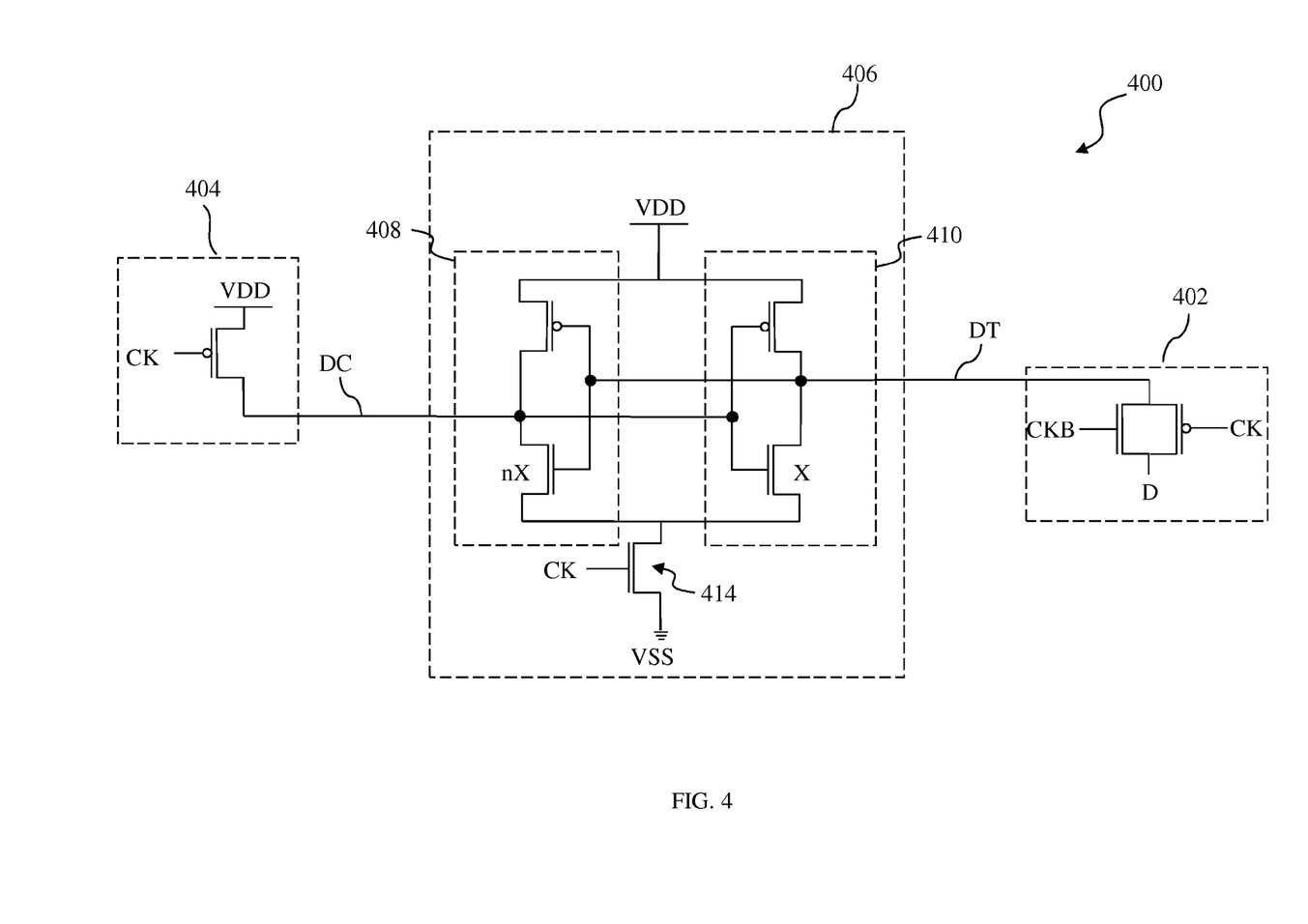
FIG. 4 shows a simplified schematic diagram of a sense-amplifier-based latch circuit according to yet another embodiment of the disclosure.

FIG. 4 shows a simplified schematic diagram of a sense-amplifier-based latch circuit 400 according to yet another embodiment of the disclosure. In this embodiment, latch circuit 400 has several differences from latch circuit 100 of FIG. 1. First, cross-coupled inverters 408 and 410 of amplification circuitry 406 are in an unbalanced configuration, where the n-type transistor of inverter 408 is n times (n>1) larger than the n-type transistor of inverter 410. Second, amplification circuitry 406 does not have a p-type transistor analogous to p-type transistor 112 of FIG. 1. Third, complement node setup circuitry 404 does not have two pairs of transistors like complement node setup circuitry 104. Rather, complement node setup circuitry 404 comprises only one p-type transistor, whose gate is controlled by the true clock signal CK and whose channel is coupled between the high-voltage reference source VDD and complement data node DC.

Before arrival of clock signal CK, suppose that data signal D is high at the start of a latching operation. In this case, complement data node DC is drawn toward the high-voltage reference source VDD via complement node setup circuitry 404, regardless of the voltage level of the input data signal D. Once the clock signal CK rises, if nodes DT and DC are both substantially at the voltage level of the high-voltage reference source VDD, then complement node DC will be drawn downward toward the low-voltage references source VSS via n-type transistor 414 because the n-type transistor of inverter 408 is larger, and consequently stronger (i.e., faster). Thus, latch circuit 400 does not require a voltage differential between nodes DT and DC when they are both at the voltage level of the high-voltage reference source VDD for the latch operation to be successful.

If, on the other hand, the input data signal D is low at the start of a latching operation and the voltage at true data node DT is sufficiently less than the voltage at complement data node DC to overcome the unequal sizing of inverters 408 and 410, then true data node DT is drawn downward toward the low-voltage reference source VSS. If the voltage level at true data node DT is not sufficiently less than the voltage level at complement node DC, then complement data node DC might be inadvertently drawn downward toward the low-voltage reference source VSS due to the larger size of the n-type transistor of inverter 408. So typically, the difference between DT and DC node should be higher than intrinsic offset of amplification circuitry 406 in the unbalanced configuration.

Compared to latch circuits 100 of FIG. 1 and 300 of FIG. 3, latch circuit 400 uses even fewer transistors, and therefore may occupy less chip area than latch circuits 100 and 300.

Figure 5:
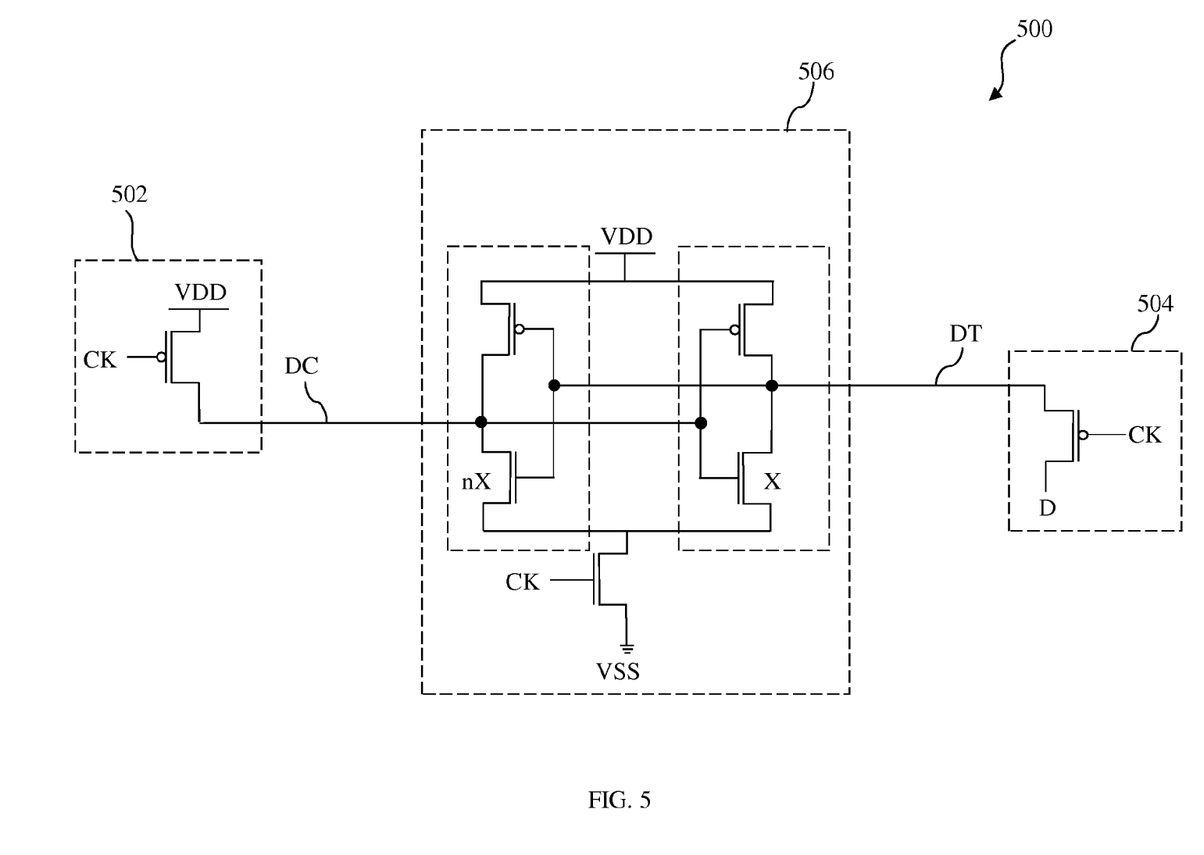
FIG. 5 shows a simplified schematic diagram of a sense-amplifier-based latch circuit according to even yet another embodiment of the disclosure.

FIG. 5 shows a simplified schematic diagram of a sense-amplifier-based latch circuit 500 according to even yet another embodiment of the disclosure. Latch circuit 500 is similar to latch circuit 400 of FIG. 4 with at least one difference. In particular, true node setup circuitry 504 comprises a single-transistor switch rather than a transmission gate. Thus, latch circuit 500 has even fewer transistors than latch circuit 400. However, since true node setup circuitry 504 only has one p-type transistor, true node setup circuitry 504 is not capable of passing strong zeros to true data node DT. Provided that sufficient differential is developed between true data node DT and complement data nod DC, amplification circuitry 506 will resolve and store data correctly.

Figure 6:
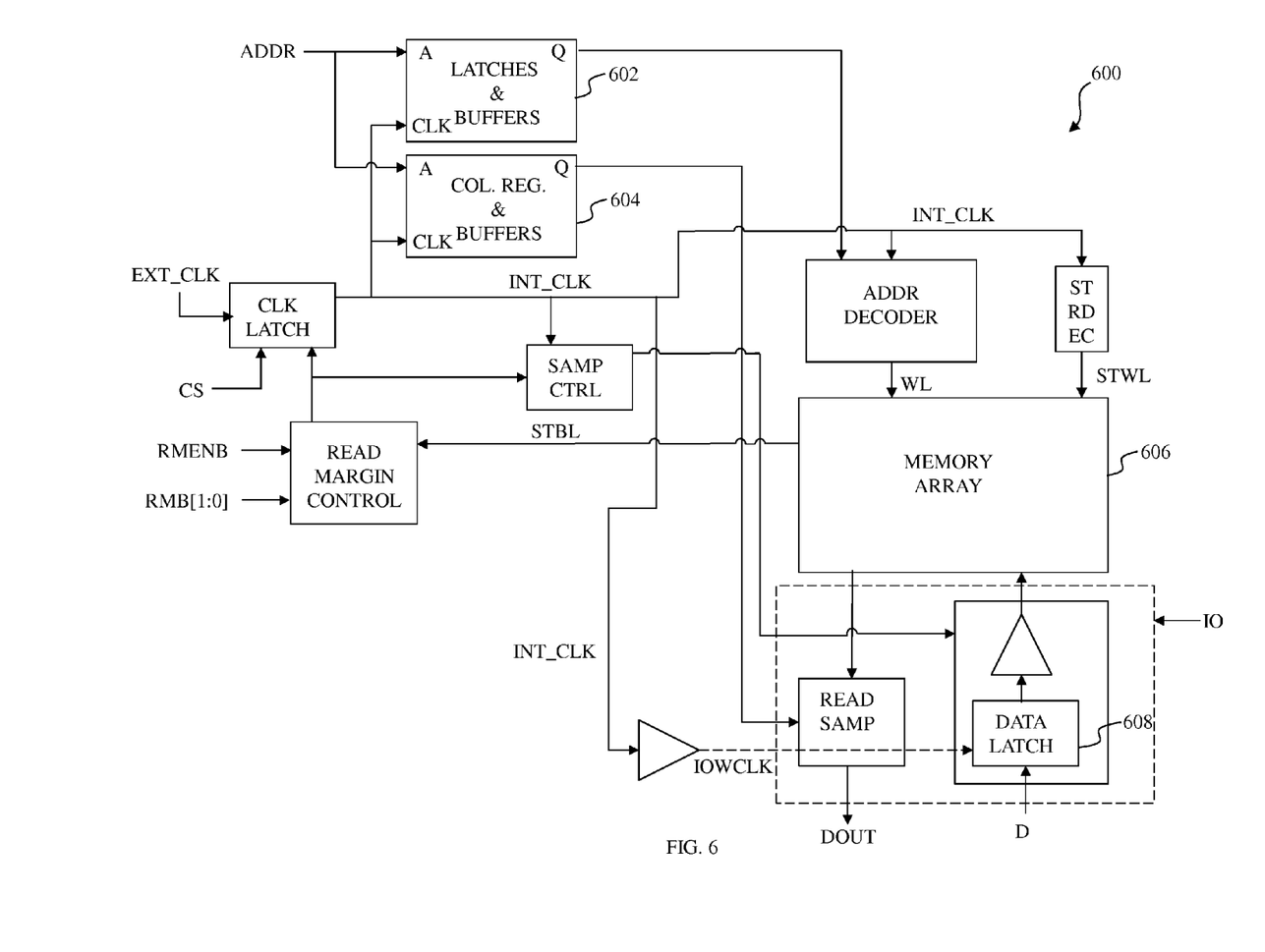
FIG. 6 shows a simplified block diagram of a memory circuit according to one embodiment of the disclosure.

FIG. 6 shows a simplified block diagram of a memory circuit 600 according to one embodiment of the disclosure. Memory circuit 600 illustrates a few of the potential uses of the latch circuits of this disclosure. Memory circuit 600 comprises memory array 606, which stores bits of information in an array of memory cells, where the cells are arranged in one or more columns and one or more rows. Each cell is identified by a unique combination of a row address and a column address of the memory array. Memory circuit 600 also comprises one or more row address latches 602, one or more column address latches 604, and one or more data latches 608, any and all of which may be implemented using any of the latch circuits of this disclosure among other circuitry (not shown). Suppose for this discussion that the row address latches 602, the column address latches 604, and the data latches 608 are all implemented using a latch circuit of the disclosure such as one of the latch circuits in FIGS. 1 and 3-5.

In operation, each row address latch 602, each column address latch 604, and each data latch 608 receives an input data signal D and outputs a latched signal from a true data node DT as described above in relation to the latch circuits of FIGS. 1 and 3-5. For each row address latch 602 and each column address latch 604, input data signal D corresponds to an address ADDR of a cell of memory array 606 that is to be accessed, and the latched value from the true data node DT corresponds to a latched address value Q. For each data latch 608, input data signal D corresponds to a data value that is to be written to a cell of memory array 606.

Note that each row address latch 602, each column address latch 604, and each data latch 608 receives a single input clock signal (i.e., INT_CLK or IOWCLK). In some embodiments, the input clock signal (i.e., INT_CLK or IOWCLK) is used as the true clock signal CK in FIGS. 1 and 3-5 and each latch implements a complement generation circuit (not shown) that generates the complement CKB of the input clock signal used in FIGS. 1 and 3-5. The complement generation circuit may be implemented using any suitable circuit that generates the complement of a signal, such as a simple inverter circuit. Note that, when the input clock signal CK and the complement clock signal CKB are skewed, the timing diagram in FIG. 2 will vary slightly. As the skew between input clock signal CK and the complement clock signal CKB increases, the duration of the setup and hold window increases.

Alternatively, in some embodiments, each latch may implement a true and complement generation circuit that generates both a true clock signal and a complement clock signal. The true clock signal, which may be a skewed copy of the input clock signal (i.e., INT_CLK or IOWCLK), is used as the true clock signal CK in FIG. 1, and the complement clock signal is used as the complement clock signal CKB in FIG. 1. The true and complement generation circuit may be implemented using any suitable circuit that generates a true signal and a complement signal from an input signal.

In some of these further embodiments, the true and complement generation circuit is a concurrent true and complement generation circuit that generates the true and complement signals concurrently such that there is little to no skew between the true and complement signals. This is illustrated in the timing diagram of FIG. 2, where the clock signal CK and complement clock signal CKB both change state concurrently.

Typically, generating a complement signal using conventional circuitry such as an inverter results in a gate delay between the true signal and the generated complement signal. By substantially eliminating the skew between the true and complement clock signals, a full gate delay can be eliminated from the setup and hold window duration, thereby reducing the duration of the setup and hold window and improving operating speed of the system.

Note also that the latch circuits in FIGS. 1 and 3-5 employ only a true data signal and do not employ a complement data signal. Since these circuits do not operate using a complement data signal and rely on a voltage differential, the setup and hold period of these circuits may be further reduced over conventional latch circuits that operate using both true and complement data signals. Thus, these circuits achieve a reduced setup duration because the voltage differential between true data node DT and complement data node DC node is setup by true node setup circuitry 102 and complement node setup circuitry 104 in parallel, and amplification circuitry 106 is capable of resolving relatively minute voltage differentials (e.g., ≤200 mv) established during the setup period, even in the presence of high capacitive and device mismatches.

In general, latch circuits of this disclosure that employ true and complement signal generation circuits that generate the true and complement signals concurrently can be implemented with setup and hold windows that are as shorter than one gate delay in duration. Typically, this is shorter than the setup and hold periods of conventional latch circuits. To further understand the operation of a concurrent true and complement signal generation circuit, consider FIG. 7.

Figure 7:
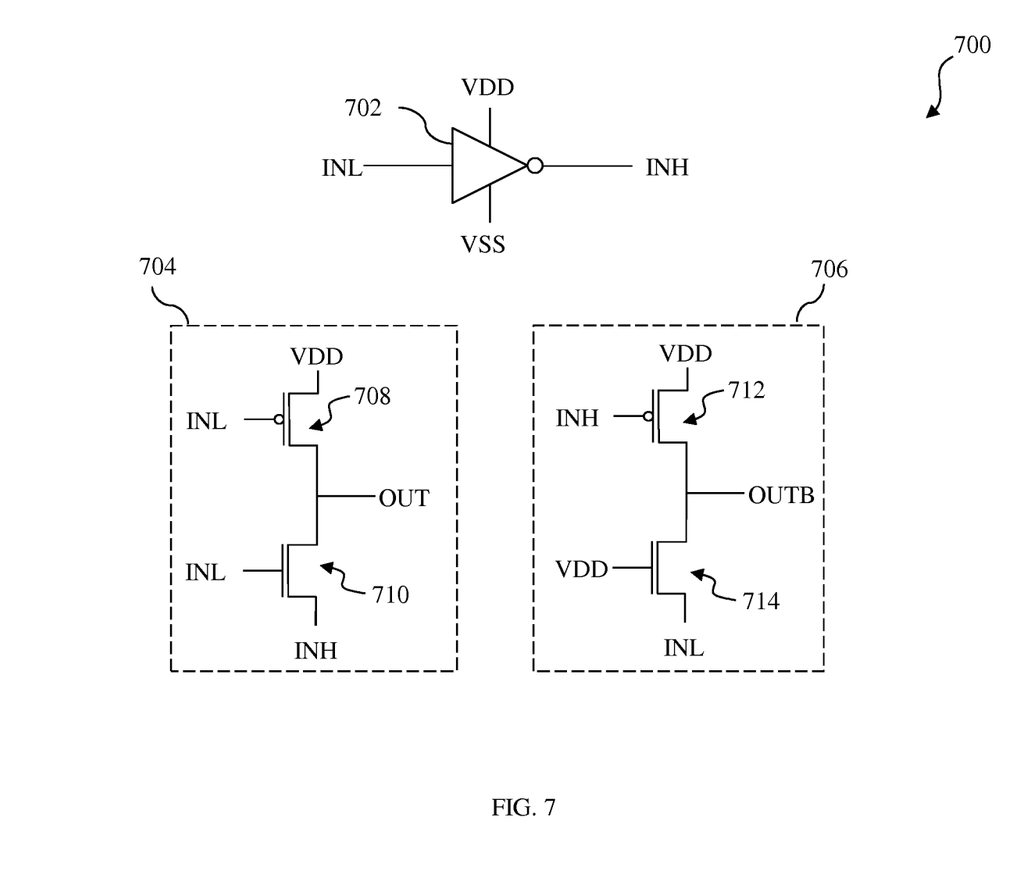
FIG. 7 shows a simplified schematic diagram of a concurrent true and complement signal generation circuit according to one embodiment of the disclosure.

FIG. 7 shows a simplified schematic diagram of a concurrent true and complement signal generation circuit 700 according to one embodiment of the disclosure. Circuit 700 concurrently generates true and complement output signals OUT and OUTB from a single active-low input signal INL, such that the true and complement output signals OUT and OUTB have little to no skew between the rising edge of true output signal OUT and falling edge of complement output signal OUTB. When implemented with the latch circuits in FIGS. 1 and 3-5, the true output signal OUT is the true clock signal CK, the complement output signal OUTB is the complement clock signal CKB, and the input signal INL is an active low clock signal that is generated upstream of circuit 700 (e.g., INT_CLK or IOWCLK in FIG. 6). Note that the edges of the true clock signal CK and the complement output signal OUTB are responsible for deciding the timing of the setup and hold period of the latch circuit. Further, note that the use of circuit 700 is not limited to clock signals and may be used for signals other than clock signals, such as to generate true and complement data signals.

Circuit 700 comprises an inverter 702, true signal generation circuitry 704, and complement signal generation circuitry 706. Inverter 702, which is coupled between the high-voltage reference source VDD and the low-voltage reference source VSS, inverts input signal INL to generate a complement INH of the input signal (i.e., an active high signal), where there exists some skew between the input signal INL and the complement input signal INH.

True signal generation circuitry 704 comprises a p-type transistor 708 and an n-type transistor 710. P-type transistor 708 has (i) a channel that is coupled between the high-voltage reference source VDD and the true output signal OUT and (ii) a gate that is controlled by input signal INL. N-type transistor 710 has (i) a channel that is coupled between the true output signal OUT and complement input signal INH and (ii) a gate that is controlled by input signal INL.

Complement signal generation circuitry 706 comprises a p-type transistor 712 and an n-type transistor 714. P-type transistor 712 has (i) a channel that is coupled between the high voltage reference source VDD and the complement output signal OUTB and (ii) a gate that is controlled by complement input signal INH. N-type transistor 714 has (i) a channel that is coupled between complement output signal OUTB and input signal INL and (ii) a gate that is controlled by the high voltage reference source VDD. To further understand the operation of circuit 700, consider FIG. 8.

Figure 8:
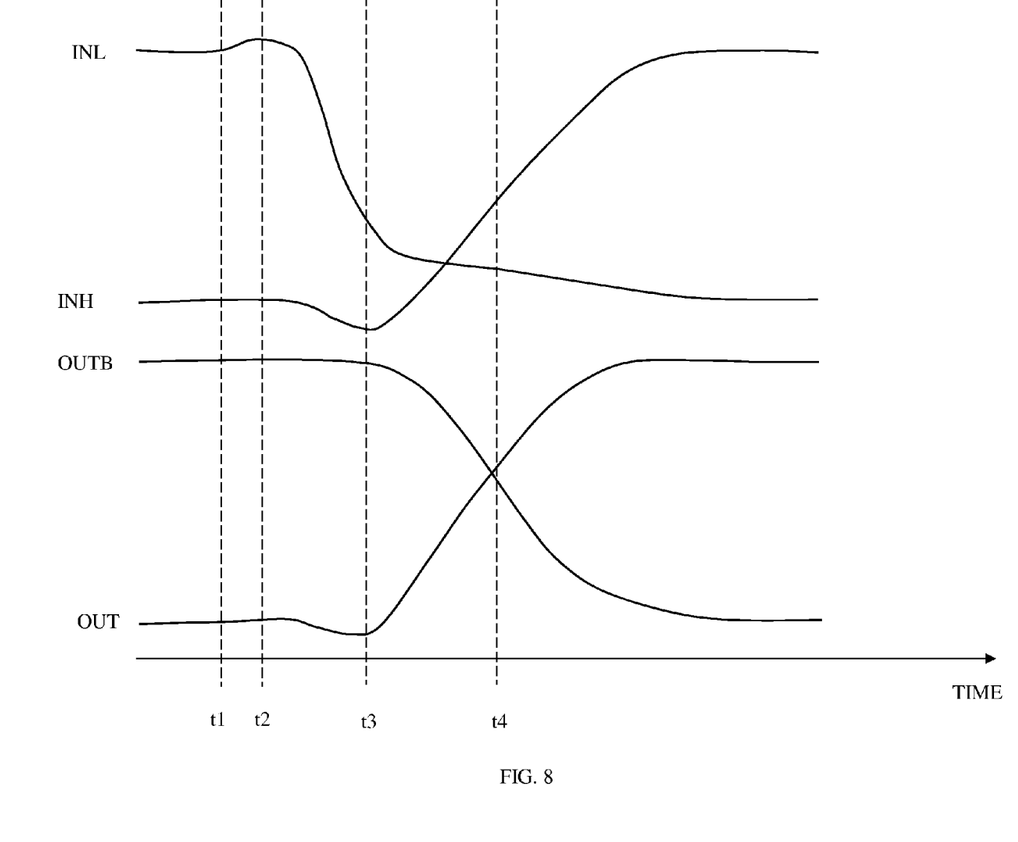
FIG. 8 shows a signal waveform diagram of an exemplary operation of the concurrent true and complement signal generation circuit of FIG. 7.

FIG. 8 shows a signal waveform diagram of an exemplary operation of concurrent true and complement signal generation circuit 700. As shown, at time t1, input signal INL is in a high state and complement input signal INH is in a low state. As a result, n-type transistor 710 of true signal generation circuitry 704 is on, p-type transistor 708 is off, and output signal OUT is in a low state due to being drawn downward toward complement input signal INH via n-type transistor 710. Further, p-type transistor 712 of complement signal generation circuitry 706 is on such that complement output signal OUTB is in a high state due to being drawn upward toward the value the high voltage reference source VDD via p-type transistor 712. Note that, since input INL is high, and complement output signal OUTB is the voltage level of the high voltage reference source VDD, n-type transistor 714 will not conduct any current. Note that, in FIG. 8, signals INL and INH are artificially shown vertically offset from signals OUT and OUTB to more clearly illustrate the operations of circuit 700.

At about time t2, input signal INL begins to draw downward toward the active low state, which causes inverter 702 to begin to draw complement input signal INH upward at time t3. The delay between the change of states of input signal INL and complement input signal INH is caused by a gate delay of inverter 702.

At time t3, both input signal INL and complement input signal INH are near the low state. As a result, n-type transistor 710 of true signal generation circuitry 704 is off and p-type transistor 708 is on such that true output signal OUT is drawn upward toward VDD via p-type transistor 708 beginning at time t3. Further, just prior to time t3, p-type transistor 712 and n-type transistor 714 of complement generation circuitry 706 are both turned on resulting in a conflict between p-type transistor 712 and n-type transistor 714, where complement output signal OUTB is pulled upward via p-type transistor 712 toward the high voltage reference source VDD and downward via n-type transistor 714 toward input signal INL. Without this conflict, complement output signal OUTB would begin to draw downward along with input signal INL at about time t2. Therefore, this conflict is introduced to slow down the change of complement output signal OUTB such that the change begins substantially concurrently with the change of true output signal OUT at time t3. At about time t4, p-type transistor 712 is turned off by complement input signal INH, and this conflict ends allowing complement output signal OUTB to be pulled downward toward the voltage level of input signal INL via n-type transistor 714.

As can be seen in FIG. 8, circuit 700 generates true output signal OUT and complement output signal OUTB such that the skew between these two signals is less than the skew between input signal INL and complement input signal INH. In fact, circuit 700 generates true output signal OUT and complement output signal OUTB such that such that there is little if any skew between true output signal OUT and complement output signal OUTB.

Figure 9:
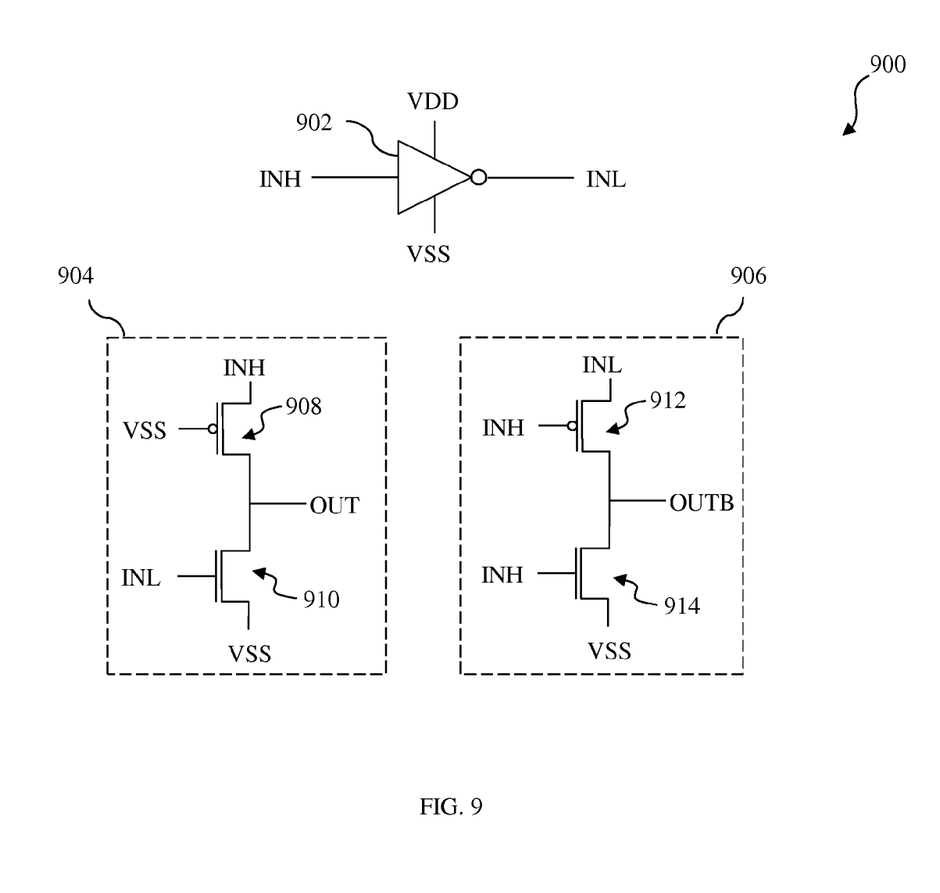
FIG. 9 shows a simplified schematic diagram of a concurrent true and complement signal generation circuit according to another embodiment of the disclosure.

FIG. 9 shows a simplified schematic diagram of a concurrent true and complement signal generation circuit 900 according to another embodiment of the disclosure. In this embodiment, the input signal is an active high signal INH and inverter 902 generates a complement input signal INL that is an active low signal. Similar to true signal generation circuitry 704 and complement signal generation circuitry 706 of FIG. 7, true signal generation circuitry 904 and complement signal generation circuitry 906 generate true and complement output signals OUT and OUTB, respectively, each using a p-type transistor connected in series with a n-type transistor. However, the connections of these transistors differ from those of FIG. 7.

In particular, p-type transistor 908 of true signal generation circuitry 904 has (i) a channel that is coupled between input signal INH and the true output signal OUT and (ii) a gate that is controlled by the low-voltage reference source VSS. N-type transistor 910 of true signal generation circuitry 904 has (i) a channel that is coupled between the true output signal OUT and the low-voltage reference source VSS and (ii) a gate that is controlled by complement input signal INL.

P-type transistor 912 of complement signal generation circuitry 906 has (i) a channel that is coupled between the complement input signal INL and the complement output signal OUTB and (ii) a gate that is controlled by input signal INH. N-type transistor 914 of complement signal generation circuitry 906 has (i) a channel that is coupled between complement output signal OUTB and the low-voltage reference source VSS and (ii) a gate that is controlled by input signal INH.

Although FIGS. 7 and 9 show embodiments which generate true output signal OUT and complement output signal OUTB such that there is little to no skew between them, embodiments of the disclosure are not so limited. According to alternative embodiments of the disclosure, concurrent true and complement signal generation circuit may be implemented such that there is at least some skew between true output signal OUT and complement output signal OUTB, although that skew is less than the skew between the input signal and complement input signal. Such embodiments may be implemented by, for example, altering the sizes of the transistors in circuits 700 and 900.

Embodiments of the disclosure may be implemented as circuit-based processes, including possible implementation as a single integrated circuit (such as an ASIC or an FPGA), a multi-chip module, a single card, or a multi-card circuit pack.

Unless explicitly stated otherwise, each numerical value and range should be interpreted as being approximate as if the word "about" or "approximately" preceded the value of the value or range.

Given the teachings of embodiments of the disclosure provided herein with reference to the accompanying drawing figures, it is to be understood that embodiments of the invention are not limited to the described embodiments, and one of ordinary skill in the art will be able to contemplate various other embodiments of the invention within the scope of the following claims. For example, although various embodiments of the disclosure have been described as comprising transistor gates and single-transistor switches, those skilled in the art would recognize that these elements are switches. Further, those skilled in the art would recognize that these elements can be implemented with other forms of switches.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the present invention is implemented using bi-polar transistor technology.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An apparatus comprising a true and complement signal generation circuit comprising:
   an inverter configured to (i) operate between a high-voltage reference source, and a low-voltage reference source, (ii) receive a true input signal, and (iii) generate a complement input signal being the complement of the true input signal;
   true signal generation circuitry configured to: (i) operate between the high-voltage reference source and the complement input signal and (ii) generate a true output signal; and
   complement signal generation circuitry configured to: (i) operate between the high-voltage reference source and the true input signal and (ii) generate a complement output signal, wherein the true signal generation circuitry and the complement signal generation circuitry are each directly coupled to both the true input signal and the complement input signal.

2. The apparatus of claim 1, wherein skew between the true and complement output signals is less than skew between the true and complement input signals.

3. The apparatus of claim 1, wherein:
   the true signal generation circuitry comprises first and second switches controlled by the true input signal; and
   the complement signal generation circuitry comprises a third switch controlled by the complement input signal and a fourth switch controlled by the high-voltage reference source.

4. The apparatus of claim 3, wherein:
   the first and the third switches are p-type transistors; and
   the second and the fourth switches are n-type transistors.

5. The apparatus of claim 1, wherein:
   the true signal generation circuitry comprises:
      a first p-type transistor coupled between the high-voltage reference source and the output signal; and
      a first n-type transistor coupled between the complement input signal and the output signal; and
   the complement signal generation circuitry comprises:
      a second p-type transistor coupled between the high-voltage reference source and the complement output signal; and
      a second n-type transistor coupled between the true input signal and the complement output signal.

6. The apparatus of claim 1, wherein the apparatus is an integrated circuit.

7. The apparatus of claim 1, wherein the true signal generation circuitry comprises at least two transistors connected in series.

8. The apparatus of claim 7, wherein the at least two transistors comprise a p-type transistor and an n-type transistor.

9. The apparatus of claim 1, wherein the complement signal generation circuitry comprises at least two transistors connected in series.

10. The apparatus of claim 9, wherein the at least two transistors comprise a p-type transistor and an n-type transistor.

11. A method for generating true and complement output signals, the method comprising:
   (a) receiving a true input signal;

(b) generating a complement input signal being the complement of the true input signal;

(c) generating the true output signal via true signal generation circuitry configured to operate between a high-voltage reference source and the complement input signal; and (d) generating the complement output signal via complement signal generation circuitry configured to operate between the high-voltage reference source and the true input signal, wherein the true signal generation circuitry and the complement signal generation circuitry are each directly coupled to both the true input signal and the complement input signal.

12. The method of claim 11, wherein skew between the true and complement output signals is less than skew between the true and complement input signals.

13. The method of claim 11, wherein the true signal generation circuitry comprises a first transistor and second transistor connected in series and wherein the complement signal generation circuitry comprises a third transistor and fourth transistor connected in series.

14. The method of claim 13, wherein the first transistor comprises a p-type transistor and wherein the second transistor comprises an n-type transistor.

15. The method of claim 14, wherein the third transistor comprises a p-type transistor and wherein the fourth transistor comprises an n-type transistor.

16. The method of claim 11, wherein:

the true signal generation circuitry comprises first and second switches controlled by the true input signal; and the complement signal generation circuitry comprises a third switch controlled by the complement input signal and a fourth switch controlled by the high-voltage reference source.

17. An apparatus comprising a true and complement signal generation circuit comprising:

an inverter configured to (i) operate between a high-voltage reference source, and a low-voltage reference source, (ii) receive a true input signal, and (iii) generate a complement input signal being the complement of the true input signal;

true signal generation circuitry configured to (i) operate between (a) one of the high-voltage reference source and the low-voltage reference source and (b) the complement input signal and (ii) generate a true output signal, wherein the true signal generation circuitry comprises a first p-type transistor coupled between the high-voltage reference source and the output signal and a first n-type transistor coupled between the complement input signal and the output signal; and complement signal generation circuitry configured to (i) operate between (a) one of the high-voltage reference source and the low-voltage reference source and (b) the true input signal, and (ii) generate a complement output signal, wherein the complement signal generation circuitry comprises a second p-type transistor coupled between the high-voltage reference source and the complement output signal and a second n-type transistor coupled between the true input signal and the complement output signal, wherein:

the true signal generation circuitry comprises first and second switches controlled by the true input signal; and the complement signal generation circuitry comprises a third switch controlled by the complement input signal and a fourth switch controlled by the high-voltage reference source.

18. The apparatus of claim 17, wherein skew between the true and complement output signals is less than skew between the true and complement input signals.

19. The apparatus of claim 17, wherein the true signal generation circuitry and the complement signal generation circuitry are each directly coupled to both the true input signal and the complement input signal.

20. The apparatus of claim 17, wherein the first switch comprises a p-type transistor, wherein the second switch comprises an n-type transistor, wherein the third switch comprises a p-type transistor, and wherein the fourth switch comprises an n-type transistor.

* * * * *